United States Patent [19]
Van Yperen et al.

[11] Patent Number: 5,410,249
[45] Date of Patent: Apr. 25, 1995

[54] METHOD AND APPARATUS FOR MAGNETIC RESONANCE IMAGING

[75] Inventors: Gerrit H. Van Yperen; Peter Van Der Meulen, both of Eindhoven, Netherlands

[73] Assignee: U.S. Philips Corporation, New York, N.Y.

[21] Appl. No.: 68,817

[22] Filed: May 27, 1993

[30] Foreign Application Priority Data

May 27, 1992 [EP] European Pat. Off. ........... 92201512

[51] Int. Cl.⁶ .............................................. G01V 3/00
[52] U.S. Cl. ..................................... 324/309; 324/307
[58] Field of Search ............... 324/300, 313, 314, 307, 324/309

[56] References Cited

U.S. PATENT DOCUMENTS

| | | | |
|---|---|---|---|
| 4,709,211 | 11/1987 | Machida et al. | 324/309 |
| 4,713,615 | 12/1987 | Barratt et al. | 324/309 |
| 4,714,884 | 12/1987 | Glover | 324/309 |
| 4,818,940 | 4/1989 | Henning et al. | 324/309 |

FOREIGN PATENT DOCUMENTS 0175184 of 0000 European Pat. Off. .

*Primary Examiner*—Louis Arana
*Attorney, Agent, or Firm*—Jack D. Slobod

[57] ABSTRACT

In a magnetic resonance imaging method multiple refocusing RF-pulses (22–26) are applied and spin-echo signals (62–66) obtained following an excitation RF-pulse (21). Imperfections in the applied RF-pulses (21–26) and the switched gradient magnetic fields (31–36, 42–46, 51–56) cause deviations from the desired phases of the nuclear dipole moments which appear as artefacts or ghosts in a resulting image. By a suitable arrangement of the application of the phase encoding values (242–248; 342–348) imposed during the measurements and/or the addition of supplemental measurements, the effects of the phase deviations in an image are significantly reduced, resulting in images in which less artefacts and ghosts are visible. Reduction of artefacts is also obtained by weighting of measured NMR-signals.

17 Claims, 12 Drawing Sheets

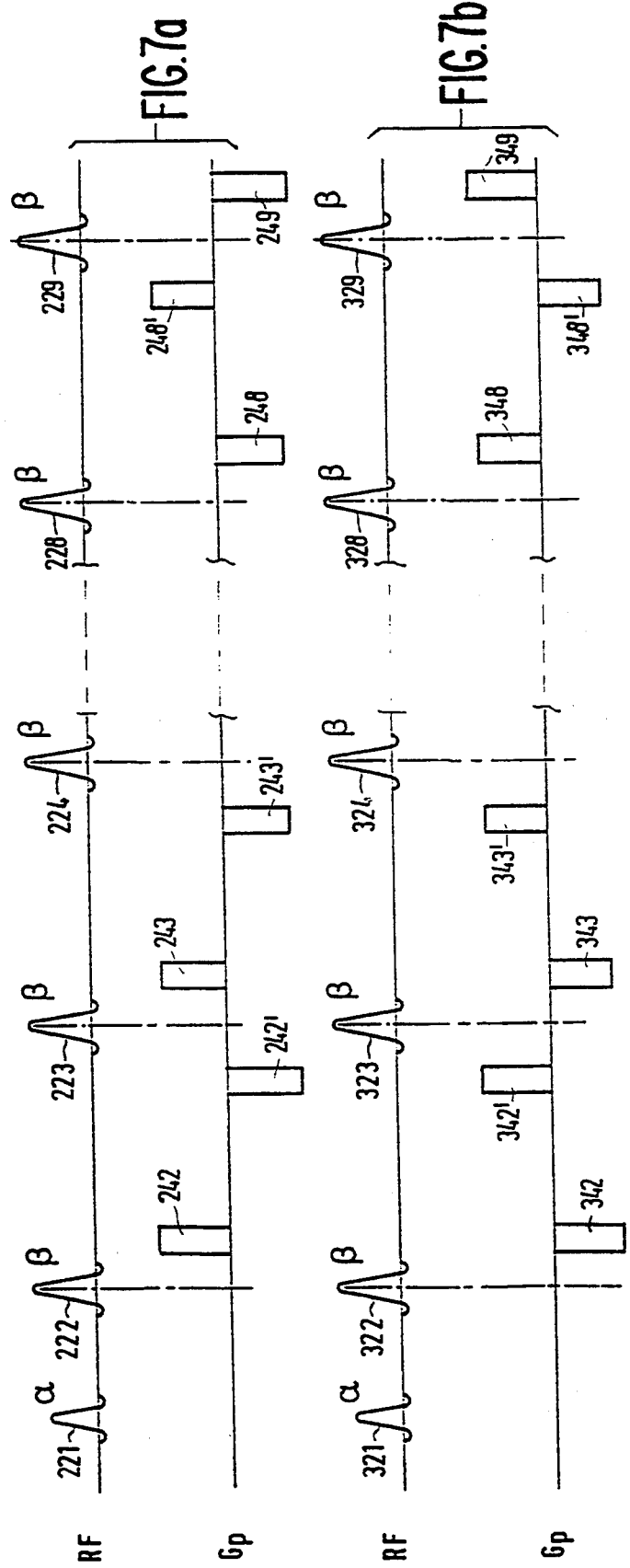

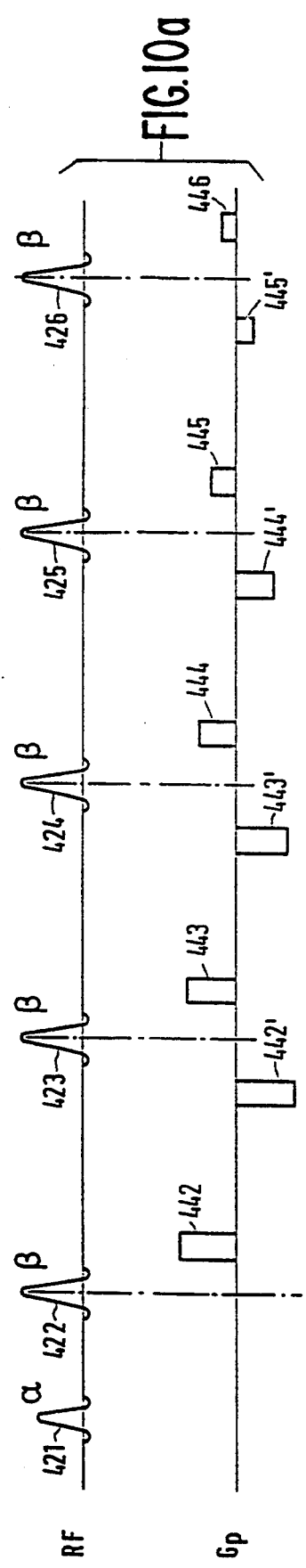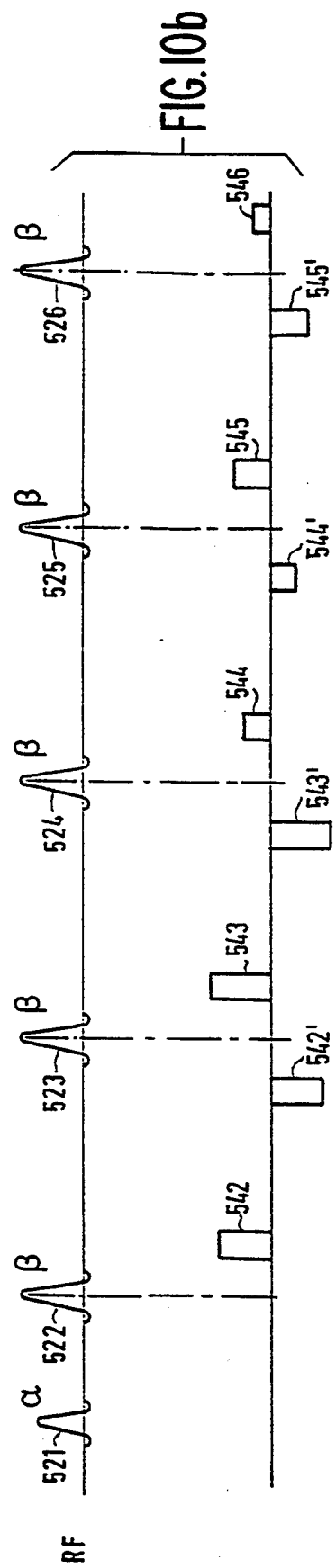

METHOD AND APPARATUS FOR MAGNETIC RESONANCE IMAGING

BACKGROUND OF THE INVENTION

1. Field of the Invention

The invention relates to a method for magnetic resonance imaging of a body placed in a stationary and substantially homogeneous main magnetic field, which method includes the application of an excitation radio-frequency pulse (RF-pulse) for excitation of nuclear dipole moments in at least a portion of the body, and the application of a plurality of refocusing RF-pulses following the excitation RF-pulse and of gradient magnetic fields for generating position dependent magnetic resonance signals in the excited portion. The applied RF-pulses form, for example, a CPMG-sequence (Carr-Purcell-Meiboom-Gill sequence) which generates multiple nuclear magnetic resonance echo signals (NMR-signals) following the refocusing RF-pulses. The invention also relates to an apparatus for magnetic resonance imaging using such a method.

2. Description of the Related Art

Such a method for imaging is known from EP-A 0 175 184, which corresponds to U.S. Pat. No. 4,818,940. As indicated in that document, a selection of a portion of the body is made by the application of a gradient magnetic field during the application of the excitation RF-pulse. This results in the excitation of a slice of the body in which slice the Larmor frequency of a selected nucleus type in the magnetic field corresponds to the frequency of the RF-pulse. The slice selection gradient magnetic field is also applied during application of the refocusing RF-pulses. For position determination of the magnetic resonance signals, a gradient magnetic field with the gradient in a first direction within the slice is applied in the interval between the refocusing RF-pulses and the measurements of the nuclear magnetic resonance (NMR) signals for phase encoding of the NMR-signals. During the measurement a second gradient magnetic field, with its gradient in a second direction within the slice and perpendicular to the first direction provides frequency encoding of the NMR-signals.

In a perfectly executed sequence the time-integrated values of the gradients are equal between refocusing RF-pulses and are twice as large as the time-integrated value of the gradients in between the excitation RF-pulse and the first refocusing RF-pulse. To obtain this in practice may be difficult due to delays or other timing inaccuracies, and due to the occurrence of eddy currents caused by switching on and off the gradient magnetic fields. In particular the eddy currents cause the gradient magnetic field pulses to have tails that may extend further than the following RF-pulse. Consequently, the time-integrated values are disturbed which leads to undesirable deviations in the phases and angles to which the nuclear dipole moments are set and the image resulting after transformation of the measured NMR-signals will exhibit artefacts. Artefacts are local low contrast, local absence of an image or the presence of ghosts in the image.

A second source of similar imaging errors or artefacts resides in the refocusing RF-pulses. Due to the variation of the magnetic field strength in the selected slice, a direct consequence of the presence of the slice selection gradient magnetic field, the refocusing RF-pulse will have a certain variation in the flip-angle across the slice. Also, this effect results in different dipole moments feeling different electromagnetic fields where they should have been subject to the same field.

In case a volume is selected as the excited portion of the body, a slice selection gradient may be absent during the RF-pulses. In addition to first and second gradient magnetic fields, a third gradient magnetic field with its gradient perpendicular to the first and second gradient magnetic fields is applied in between the RF-pulses and the measurements of the NMR-signals for additional phase encoding in that direction. Also, the switching of this third gradient magnetic field may contribute to artefacts in the resulting image.

SUMMARY OF THE INVENTION

It is, inter alia, an object of the invention to provide a magnetic resonance method in accordance to the introductory paragraph in which artefacts in the resulting image are significantly suppressed. Thereto, the invention provides a method for magnetic resonance imaging of a body placed in a stationary and substantially homogeneous main magnetic field, the method comprising the application of an excitation radio-frequency pulse (RF-pulse) for excitation of nuclear dipole moments in at least a portion of the body, the application of a plurality of refocusing RF-pulses following said excitation RF-pulse and of gradient magnetic fields for generating position dependent magnetic resonance signals in the excited portion, the gradient magnetic fields and/or refocusing RF-pulses providing phase encoding of nuclear dipole moments with actual phase encoding values having deviations from nominal phase encoding values, the measurement of a set of magnetic resonance signals, the set comprising signals which follow at least a number of said refocusing RF-pulses, the transformation of said set of measured magnetic resonance signals into an image, the set of signals being altered prior to said transformation for reducing the effect on said image of the deviations between said actual and said nominal phase encoding values.

The invention is based upon the realisation that artefacts in the image largely result from incorrect phases and angles imposed locally upon the magnetisation vector and the realisation that small phase errors may cause artefact levels comparable to those due to relatively large amplitude modulations. The invention is also based upon the further realisation that the imperfect RF-pulses and gradient field pulses cause not a random phase deviation but a phase modulation that can largely be compensated for by an alteration of the total set of measurements input to the image forming transformation. The alteration of the set of measurements includes performing the measurements according to a prescribed sequence, addition of further measurements or reducing the influence of certain measurements in the transformation process and the resulting image.

In a first realisation of the method according to the invention the measured signals comprise imaginary and real parts and wherein the set of measurements is altered for having, after transformation, the effects of the phase deviations of the phase encoding values mainly in the imaginary part of the image values resulting from the transformation. The alteration of the set of measurements to push the artefacts into the imaginary parts of the image values can be achieved by time-ordering and averaging of the measurements. Having the effects of phase deviations, i.e. ghosts, in the imaginary part of the image values, i.e. at 90° relative phase to the actual image, has the advantage that the intensity of ghosts adds up quadratic with the real part of the image values. As the real part values are significantly larger, the quadratic addition of the imaginary values has only a minor or insignificant effect upon the intensity profile in a homogeneous object in the body. Alternatively, the errors can be avoided altogether by constructing an image using the real parts only, not the modulus of the image values.

According to the invention, the desired effect is obtained in a method wherein signals are measured with opposite phase encoding values and a substantial fraction of those signals are both measured succeeding an RF-pulse with an even rank number or are both measured succeeding an RF-pulse with an odd rank number. In first order, the phase deviation in the measurements is a simple alternation from one NMR-signal to the next, this is a direct consequence of the refocusing RF-pulses. Within a certain volume element, all odd signals have approximately the same phase deviation and the same is true for all even signals. This is used to ascertain that measurements with comparable contributions to the resulting image have opposite phase encoding values, whereby the net effects of the phase deviations are pushed into the imaginary part during the transformation.

In a practical embodiment of the method according to the invention the signals are measured in an even plurality of sequences, each sequence comprising an excitation RF-pulse, a plurality of refocusing RF-pulses alternated with measurements of magnetic resonance signals and switched gradient magnetic fields for phase encoding, the phase encoding values in the different sequences being linearly interleaved, and wherein the measurements with the extreme phase encoding values are all being measured first or all being measured last in a sequence. Compared to a conventional linearly interleaved set of sequences, this means shifting phase encoding values and swapping around of measurements with the most positive, or most negative, phase encoding values in half of the sequences. To minimize the influence of strong changes in the phase encoding values upon the NMR-signals it is preferred to have the extreme phase encoding values last in a sequence.

In a further development of the method according to the invention the signals are measured in a plurality of sequences, each sequence comprising an excitation RF-pulse, a plurality of refocusing RF-pulses alternated with measurements of magnetic resonance signals and switched gradient magnetic fields for phase encoding, the phase encoding values covering a phase encoding range in a plurality of discrete basic steps, and wherein the phase encoding values in the different sequences being linearly interleaved with a step size within a sequence corresponding to an odd number of basic steps. An odd number of basic phase encoding steps enables a more perfect symmetrisation between positive and negative phase encoding values.

In a second realisation of the method according to the invention the alteration of the set of measured signals comprises the measurement of equivalent signals for a substantial fraction of the measured signals and the averaging of the signals and the equivalent signals, the difference between the actual phases and the nominal phases for said signals and said equivalent signals being substantial opposite. In this realisation the set of measurements is altered by providing two measurements for each phase encoding value, the two measurements having opposite phase deviations. The effects of the deviation in the phase encoding values is thereby mitigated.

In a first embodiment of the method according to the second realisation of the invention, wherein signals are measured in a plurality of sequences, each sequence comprising an excitation RF-pulse, a plurality of refocusing RF-pulses alternated with measurements of magnetic resonance signals and switched gradient magnetic fields for phase encoding, wherein for a substantial fraction of the sequences an equivalent sequence is executed in which the same gradient magnetic fields are applied to the body in time-reversed order for time-reversed detection of equivalent measured signals, the same phase encoding value occurring in one sequence in an odd rank number and in the equivalent sequence in an even rank number. In this realisation, as an additional advantage, the decrease in signal amplitude due to spin-spin relaxation, the $T_2$-decay, within a sequence is compensated by providing identical measurements but with different signal amplitudes. The effect of amplitude modulation due to the $T_2$-decay, leading to blurring and ringing artefacts in the resulting image, is reduced.

In a second embodiment of the second realisation, wherein the measurements in a plurality of sequences, each sequence comprising an excitation RF-pulse, a plurality of refocusing RF-pulses alternated with measurements of magnetic resonance signals and switched gradient magnetic fields for phase encoding, the equivalent measurements are obtained in an equivalent sequence in which the same gradient magnetic fields are applied to the body in pairwise swapped order. Also in this embodiment the even/odd behaviour of phase deviations over NMR-signals is averaged. This embodiment provides good results, in particular, if the phase variation is not a simple phase alternation. In such circumstances averaging is useful only between signals that are near each other and subject to approximately the same phase deviations. If the number of NMR-signals measured in each sequence is odd one signal remains unpaired and unswapped, this has only little effect upon the quality of the resulting image.

In a third embodiment of this second realisation, the equivalent measurements are obtained with the same gradient magnetic field and following subsequent refocusing RF-pulses. If a measurement with the same phase encoding value is to be repeated, for example, because of signal to noise considerations, the measurements with identical phase encoding values are made in the same sequence. Again, the disturbances in phase encoding values due to eddy currents and RF-pulse imperfections are averaged because of the even-odd behaviour of the phase deviation. The number of measurements at each phase encoding value is preferably even for optimum cancelation. An additional advantage of this embodiment is that if the variation in the magnitude of the gradient pulses is gradual, the effect upon the phases of the spins due to eddy currents caused by switching the gradient magnetic fields are to a large extent compensated in subsequent spin-echoes.

In a third realisation of the method according to the invention the gradient magnetic fields are switched for changing the phase encoding values between measurements, the largest phase encoding values being early in a sequence, and the alteration of the set of measured signals comprises weighting the measured signals with a weighting function that depends on the phase encoding value of each measurement in the set. As the phase deviations averages out in the course of a sequence, their magnitude decreases when measurements of NMR-signals are later in a sequence. Accordingly, a reduction of the artefacts in the resulting image can be obtained by changing the relative weight with which measurements within a sequence contribute to the transformation process. To avoid reduction of the image contrast, the relative weight of low phase encoding values should not be reduced and, in this realisation, low phase encoding values should not be present in the beginning of a sequence.

In the method according to the invention wherein the refocusing RF-pulses have a value deviating from 180°, and have preferably a value of around 150°. By using a flip-angle other than 180° for the refocusing RF-pulses an exchange between phase and amplitude modulation in the NMR-signals is possible. As artefacts due to phase modulation are suppressed in the invented method, a total reduction of the presence of artefacts can be obtained.

The invention also relates to an apparatus for performing such a method. An apparatus according to the invention for magnetic resonance imaging of a body placed in a stationary and substantially homogeneous main magnetic field comprises means for establishing the main magnetic field, means for generating gradient magnetic fields superimposed upon the main magnetic field, means for radiating RF-pulses towards a body placed in the main magnetic field, control means for steering the generation of the gradient magnetic fields and the RF-pulses, and means for receiving and sampling magnetic resonance signals generated by sequences of RF-pulses and switched gradient magnetic fields, said control means being arranged for applying an excitation radio-frequency pulse for excitation of nuclear dipole moments in at least a portion of the body, applying a plurality of refocusing RF-pulses following said excitation RF-pulse and gradient magnetic fields for generating position dependent magnetic resonance signals in the excited portion, measurement of a set of magnetic resonance signals, the set comprising signals which follow at least a number of said refocusing RF-pulses, the apparatus further comprising means for transforming the set of measured magnetic resonance signals into an image, and means altering the set of signals to said transformation for reducing the effect on the image of deviations between actual and nominal phase encoding values, deviations which are due to the refocusing RF-pulses and/or switched gradient magnetic fields. The alteration of the set of measurements for reduction of artefacts has as an advantage that it is not necessary to modify the construction of the MRI apparatus. In particular, shielding of the coils for generating the gradient magnetic fields in order to reduce the effects of eddy currents can be reduced or done away with completely.

BRIEF DESCRIPTION OF THE DRAWINGS

These, and other more detailed aspects of the invention will now be elucidated by way of example with reference to the accompanying drawings, wherein:

FIGS. 7a and 7b show two sequences of RF-pulses and gradient magnetic fields according to a second realisation of the invention;

FIGS. 10a and 10b show sequences of RF-pulses and gradient magnetic fields according to another embodiment of the invention;

DETAILED DESCRIPTION OF THE PREFERRED EMBODIMENTS

Figure 1:
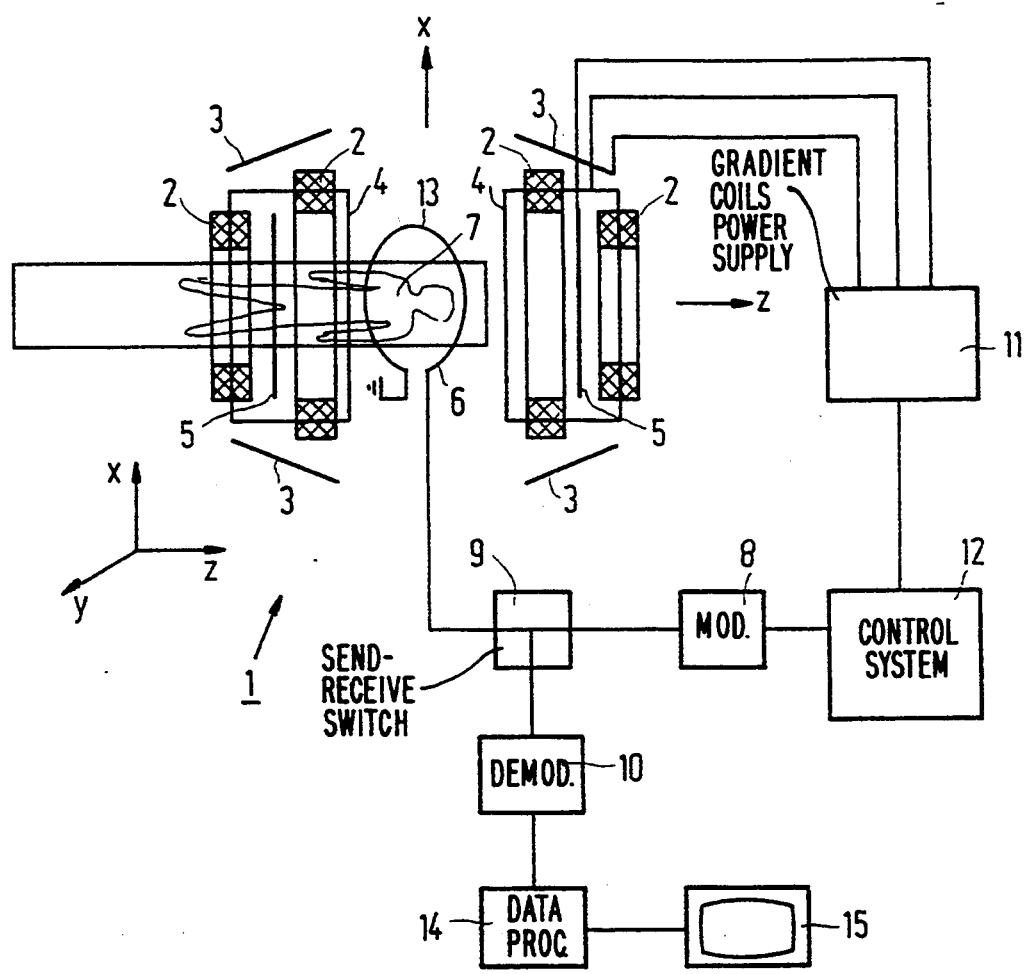
FIG. 1 shows diagrammatically a magnetic resonance imaging apparatus, suitable for the method according to the invention.

In FIG. 1 is a magnetic resonance apparatus 1 diagrammatically shown. The apparatus comprises a set of main magnetic coils 2 for generating a stationary homogeneous main magnetic field and several sets of gradient coils 3, 4 and 5 for superimposing additional magnetic fields with controllable strength and having a gradient in a selected direction. Conventionally, the direction of the main magnetic field is labelled the z direction, the two directions perpendicular thereto the x and y directions. The gradient coils are energised via a power supply 11. The apparatus further comprises emitting means 6 for emitting radio-frequency pulses (RF-pulses) to an object or body 7, the radiation means being coupled to modulating means 8 for generating and modulating of the RF-pulses. Also provided are means for receiving the NMR-signals, these means can be identical to the emitting means 6 or be separate. If the emitting and receiving means are identical, as shown in the figure, a send-receive switch 9 is arranged to separate the received signals from the pulses to be emitted. The received NMR-signals are input to receiving and demodulating means 10. The emitting means 6 and 8 and the power supply 11 for the gradient coils 3, 4 and 5 are steered by a control system 12 to generate a predetermined sequence of RF-pulses and gradient field pulses.

The demodulation means is coupled to a dam processing unit 14, for example a computer, for transformation of the received signals into an image that can be made visible, for example on a visual display unit 15.

If the magnetic resonance apparatus 1 is put into operation with an object or body 7 placed in the magnetic field, a small excess of nuclear dipole moments (nuclear spins) in the body will be aligned in the direction of the magnetic field. In equilibrium, this causes a net magnetisation $M_0$ in the material of the body 7, directed in parallel with the magnetic field. In the apparatus 1 the macroscopic magnetisation $M_0$ is manipulated by radiating to the body RF-pulses having a frequency equal to the Larmor frequency of the nuclei, thereby bringing the nuclear dipole moments into excited state and re-orienting the magnetisation $M_0$. By applying the proper RF-pulses, a rotation of the macroscopic magnetisation is obtained, the angle of rotation is called the flip-angle. The introduction of variations in the magnetic field by applying gradient magnetic fields influences the behaviour of the magnetisation locally. After the application of RF-pulses, the changed magnetisation will strive to return to a state of thermal equilibrium in the magnetic field, emitting radiation in the process. A well chosen sequence of RF-pulses and gradient field pulses causes this radiation to be emitted as NMR-signals which provide information about the density of a certain type of nuclei, for example hydrogen nuclei, and the substance in which they occur. By analysis of the emitted signals and presentation of it in the form of images, information about the internal structure of the object or body 7 is accessible. For a more detailed description of magnetic resonance imaging (MRI) and MRI-devices reference is made to the extensive literature on this subject, for example to the book "Practical NMR Imaging", edited by M. A. Foster and J. M. S. Hutchinson, 1987, IRL Press.

Figure 2:
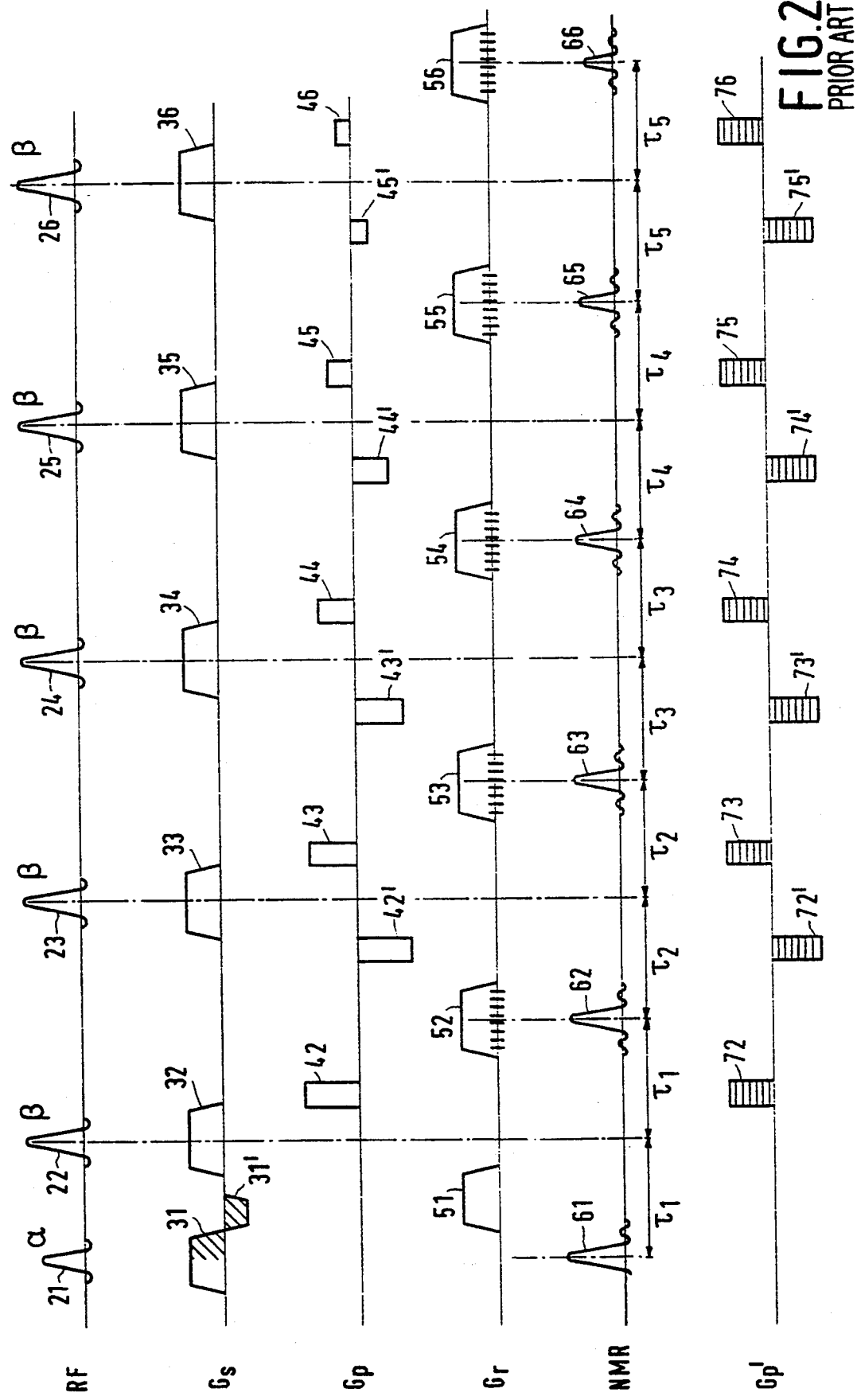
FIG. 2 shows a sequence of an excitation RF-pulse, a plurality of refocusing RF-pulses, gradient magnetic fields and the occurrence of NMR-signals as a function of time.

FIG. 2 shows a known sequence of RF-pulses and magnetic field gradients for obtaining multiple spin-echo NMR-signals following a single excitation pulse. In the upper line RF the start of the sequence is indicated with an excitation RF-pulse 21 having a flip-angle $\alpha$, followed after an interval $\tau_1$ by a first refocusing RF-pulse 22 having a flip-angle $\beta$. Normally, the values of $\alpha$ and $\beta$ are 90° and 180°, respectively. Following the excitation RF-pulse 21, a free induction decay (FID) nuclear magnetic resonance signal 61, indicated on the lower line NMR, is generated which dies out rapidly when the individual precessing nuclear magnetic dipole moments lose phase coherence due to local variations in the magnetic field. The refocusing RF-pulse 22 reverses the direction of these individual magnetic dipole moments without affecting the local magnetic field. Consequently, the dephasing is reversed into a rephasing resulting after an equal interval $\tau_1$ in the occurrence of a NMR spin-echo signal 62. After the spin-echo signal 62 the dipole moments dephase again. Repetition of refocusing RF-pulses 23, 24, 25 and 26 cause subsequent reversals of the dephasing and the repeated occurrence of NMR spin-echo signals 63, 64, 65 and 66. Due to non-compensated effects, mainly spin-spin relaxation with a time constant $T_2$, the magnitude of subsequent echoes decreases in time. The interval lengths $\tau_2$, $\tau_3$, $\tau_4$ and $\tau_5$ between an NMR-signal and the next refocusing RF-pulse are normally chosen to be equal in length.

The effect of the RF-pulses is made selective to a portion of the body 7 by applying, simultaneously with the RF-pulses a slice selection gradient, which is indicated on the second line $G_s$ in the figure. As indicated by 31 the slice selection gradient is first applied during the excitation RF-pulse 21. The dephasing caused by this first gradient 31 is compensated by an opposite gradient 31'. Also during the application of the refocusing RF-pulses 22-26 slice selection gradients 32-36 are switched on. For position determination within the selected slice, phase encoding gradient pulses 42, 43, 44, 45 and 46 with the gradient direction within the selected slice, indicated on the third line $G_p$, are applied in the interval between the RF-pulse and the NMR spin-echo signals 62, 63, 64, 65 and 66. In addition, frequency encoding or read gradients 52, 53, 54, 55 and 56, indicated on the fourth line $G_r$, having a gradient direction also within the selected slice but perpendicular to the gradient direction of the phase encoding field, are switched on during the occurrence of the spin-echo signals. The dephasing effects of the phase encoding gradients is removed after the occurrence of the spin-echo signals by applying further gradient field pulses 42', 43', 44', 45' with the same time-integrated size but with the gradient direction opposite compared to the preceding gradient pulses 42, 43, 44, 45, respectively. The dephasing effect of the read gradients 52, 53, 54, 55 and 56 is compensated for by the refocusing RF-pulses. An initial dephasing gradient 51 preceding the first refocusing RF-pulse 22 is then necessary, this initial dephasing gradient 51 has half the time-integrated size of the read gradients 52, 53, 54, 55 and 56.

Alternatively, not a slice but a volume portion of the body can be selected. In that case the slice selection gradient $G_s$ may be absent or adopted for selection of a thick section of the body. In addition to the mentioned gradient fields, a second phase encoding gradient magnetic field $G_p$, is applied having a gradient direction perpendicular to the gradient directions of the first phase encoding field $G_p$ and the read gradient field $G_r$. Like the first phase encoding field $G_p$, this second gradient encoding field is applied as a series of gradient pulses 72, 73, 74, 75, 76, following the RF-pulses and compensating gradient pulses 72', 73', 74', 75', following the NMR-signals. As indicated by horizontal lines in gradient pulses 72-76 and 72'-76', the size of the second phase encoding gradient pulses are kept constant when the first phase encoding gradient pulses are varied. Alternatively, the first phase encoding gradient pulses 42-46 and 42'-45' may be kept constant and the second phase encoding gradient pulses be varied within a sequence. Hereinafter, the embodiments of the invention are described in the two-dimensional slice selection mode. However, extension to three-dimensional volume imaging by the application of a second phase encoding field is straightforward.

After acquisition of the NMR-signals, for example 256 spin-echo signals each with a different phase encoding value and each sampled 256 times, the total set of measurements is converted into an image by means of a Fourier transform (FT). As a consequence of the above described procedure two kinds of image errors may appear in the resulting image. The first is that the signal size of subsequent NMR-signals in a sequence reduces due to spin-spin relaxation, the $T_2$-decay, this causes blurring in the resulting image. A second, and as it appears, more important source of image errors is that imperfections in the switched gradient magnetic field pulses and the refocusing RF-pulses cause residual phase effects in the spins. These residual phase effects provide a false position information and show as artefacts and ghosts in the image after Fourier transformation.

The residual phase effects caused by the refocusing RF-pulses is due to the presence of the slice selection gradient, that prohibits a uniform flip-angle β to occur across the full thickness of the selected slice. The imperfections in the gradient magnetic field pulses are due to timing errors and eddy currents in the gradient coils for generating the gradient fields. These timing errors and eddy currents influence the time-integrated size of the gradient pulses. Consequently, some residual gradient field is left after each measurement cycle, the residual gradient field causing an additional and undesired phase encoding effect.

Figure 3:
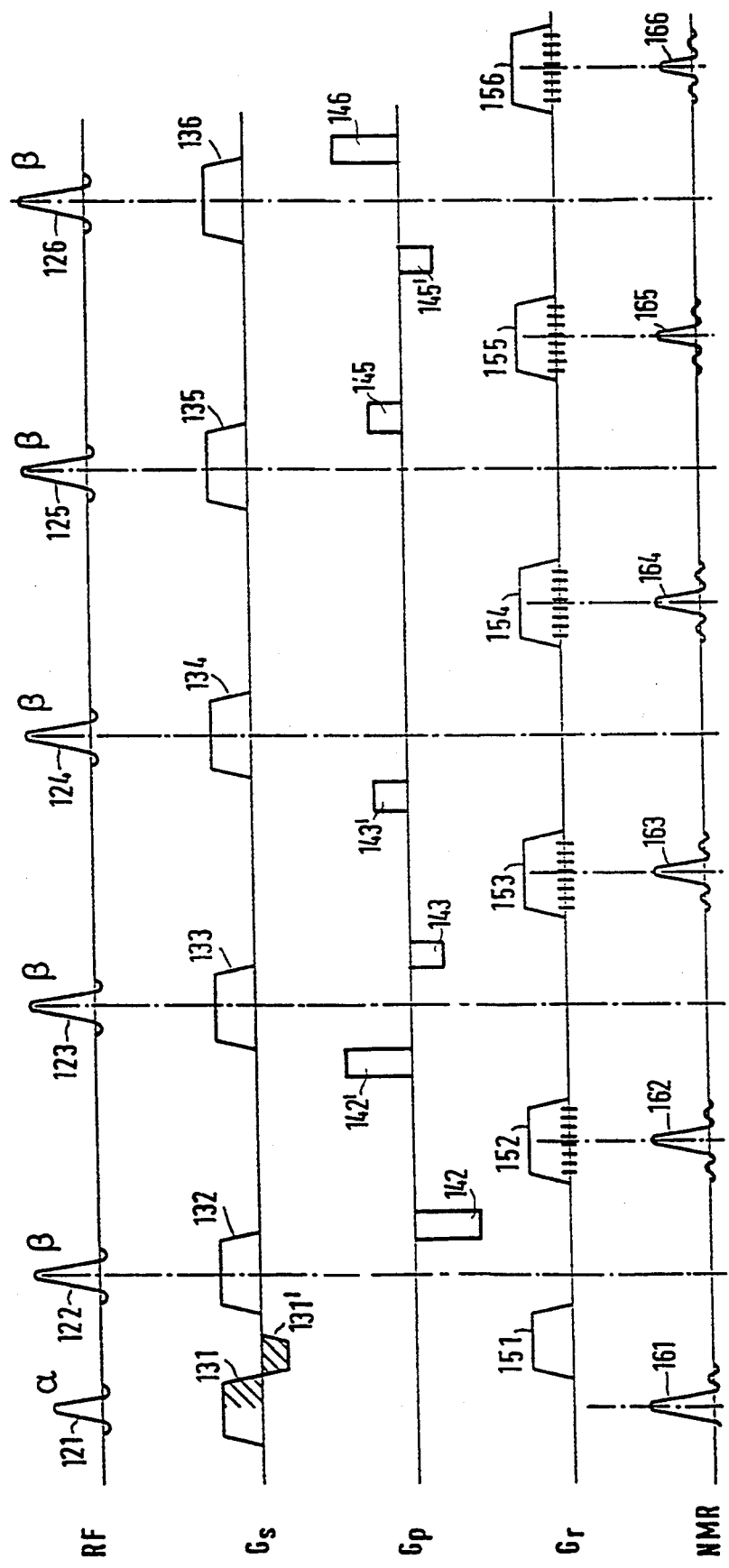
FIG. 3 shows a sequence according to a first realisation of the method according to the invention.

In FIG. 3 a sequence of an NMR imaging method, modified according to a first realisation of the invention, is illustrated in which the negative effects of the mentioned imperfections on the resulting image are reduced. The sequence shown, essentially differs from the one shown in FIG. 2 only in respect of the ordering of phase encoding values. The RF-pulses, slice selection and read gradient magnetic fields will not be described as they are similar as shown in FIG. 2. In the sequence shown in FIG. 3, care is taken that positive and a negative phase encoding values with the same absolute size both follow a RF-pulses with an even or odd rank number. Gradient pulses 142 and 146 follow RF-pulses 122 and 126, both with an odd rank number. Gradient pulses 143 and 145 follow RF-pulses 123 and 124, both with an even rank number.

In table I below, a scheme is given for measuring NMR-signals at 256 equally stepped phase encoding values, having values from −128 to +127, in eight sequences. 32 NMR-signals with different phase encoding values are measured in each sequence, the phase encoding values being linearly interleaved in the eight sequences. In the table the phase encoding values are indicated in a matrix in which the rows represent the sequences and the columns the rank number of the NMR-signals or echoes within each sequence:

TABLE I

|    | E1   | E2   | ... | E16 | E17 | ... | E31  | E32  |
|----|------|------|-----|-----|-----|-----|------|------|
| S1:| −124 | −116 | ... | −4  | +4  | ... | +116 | +124 |
| S2:| −123 | −115 | ... | −3  | +5  | ... | +117 | +125 |
| S3:| −122 | −114 | ... | −2  | +6  | ... | +118 | +126 |
| S4:| −121 | −113 | ... | −1  | +7  | ... | +119 | +127 |
| S5:| −120 | −112 | ... |  0  | +8  | ... | +120 | −128 |
| S6:| −119 | −111 | ... | +1  | +9  | ... | +121 | −127 |
| S7:| −118 | −110 | ... | +2  | +10 | ... | +122 | −126 |
| S8:| −117 | −109 | ... | +3  | +11 | ... | +123 | −125 |

As can be seen, with the exception of the values in the first sequence, phase encoding values with equal size and opposite signs both occur in even echoes or both occur in odd echoes. It is also seen from this table that all extreme phase encoding values are located in the last echo E32 of each sequence. An alternative, providing the same effect, would be to shift all extreme phase encoding values to the first echo of each sequence. However, for minimizing eddy current effects the scheme as shown is preferred.

Table II shows a scheme in which the number of sequences is odd, the 256 phase encoding values are measured in seven sequences having 37 phase encoding values each:

TABLE II

|    | E1   | E2   | ... | E18 | E19 | E20 | ... | E36  | E37  |
|----|------|------|-----|-----|-----|-----|-----|------|------|
| S1:| *    | −122 | ... | −10 | −3  | +4  | ... | +116 | +123 |
| S2:| −128 | −121 | ... | −9  | −2  | +5  | ... | +117 | +124 |
| S3:| −127 | −120 | ... | −8  | −1  | +6  | ... | +118 | +125 |
| S4:| −126 | −119 | ... | −7  |  0  | +7  | ... | +119 | +126 |
| S5:| −125 | −118 | ... | −6  | +1  | +8  | ... | +120 | +127 |
| S6:| −124 | −117 | ... | −5  | +2  | +9  | ... | +121 | *    |
| S7:| −123 | −116 | ... | −4  | +3  | +10 | ... | +122 | *    |

In this scheme, the positive and negative phase encoding values are symmetrical around zero, this provides a better matching between the positive and the negative values. Only the 0 and −128 values remain unmatched. There is no shifting of the extreme values necessary. The signals indicated in the table with * are not used. In order to avoid such unused signals in a series of sequences, it is also possible to reduce the number of measurements and to forfeit an incomplete last sequence.

Figure 4A:
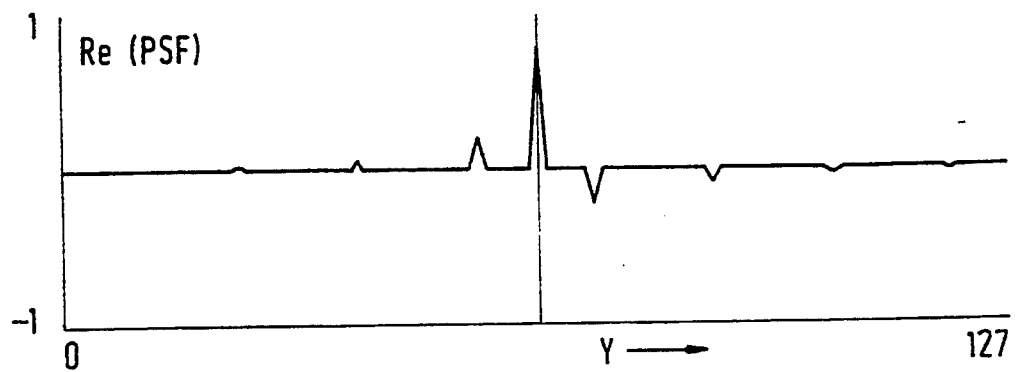
FIGS. 4a, 4b and 4c show the imaginary and real parts and the modulus of the point spread function resulting from a conventional set of measurements.
Figure 4B:
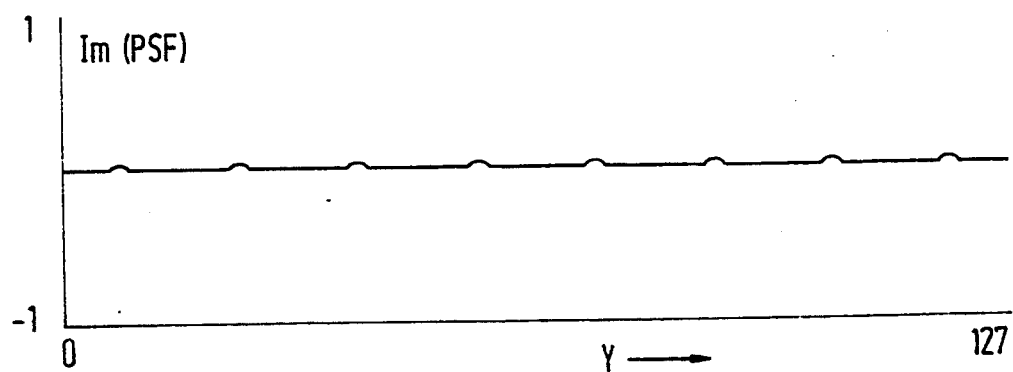
Figure 4C:
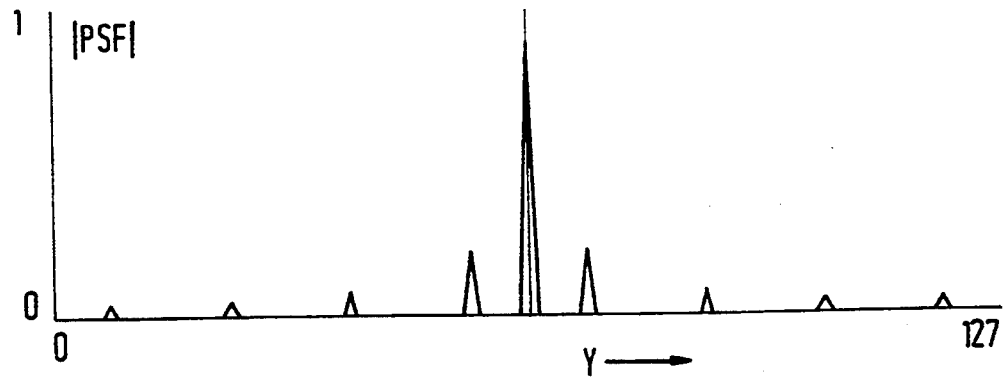
Figure 5A:
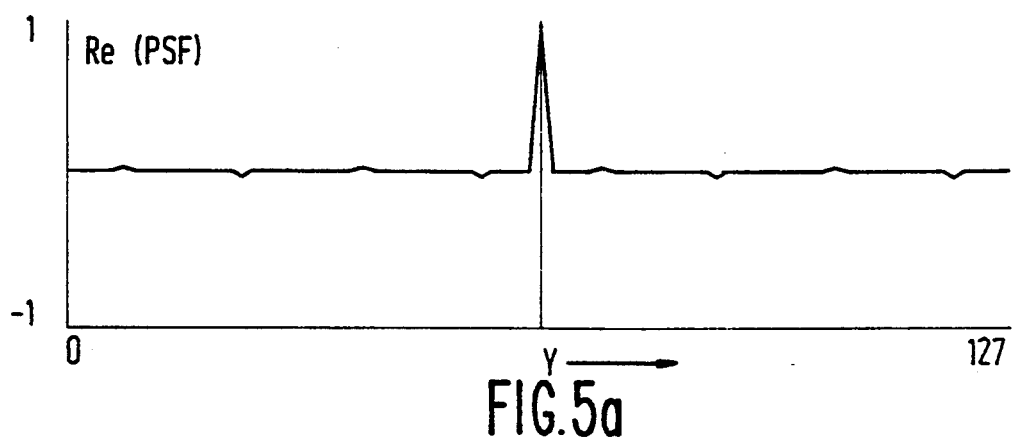
FIGS. 5a, 5b and 5c show the imaginary and real parts and the modulus of the point spread function resulting from an embodiment of the first realisation.
Figure 5B:
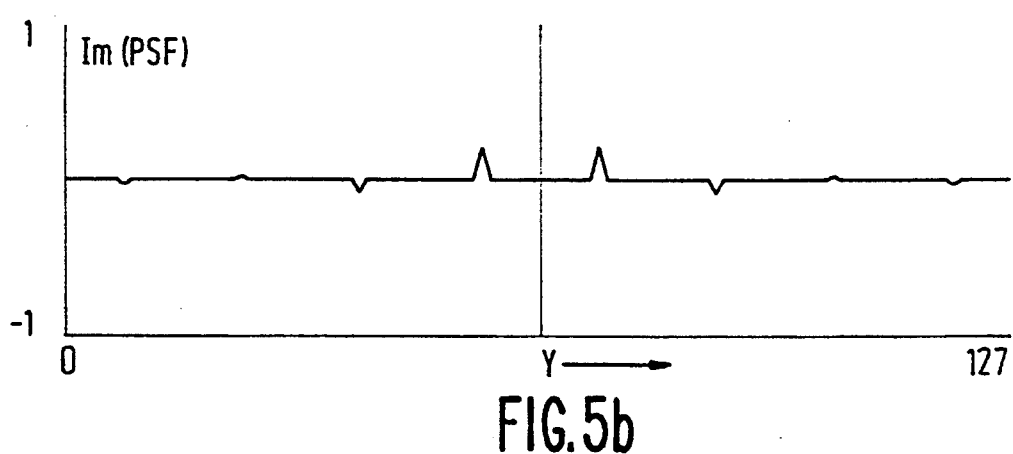
Figure 5C:
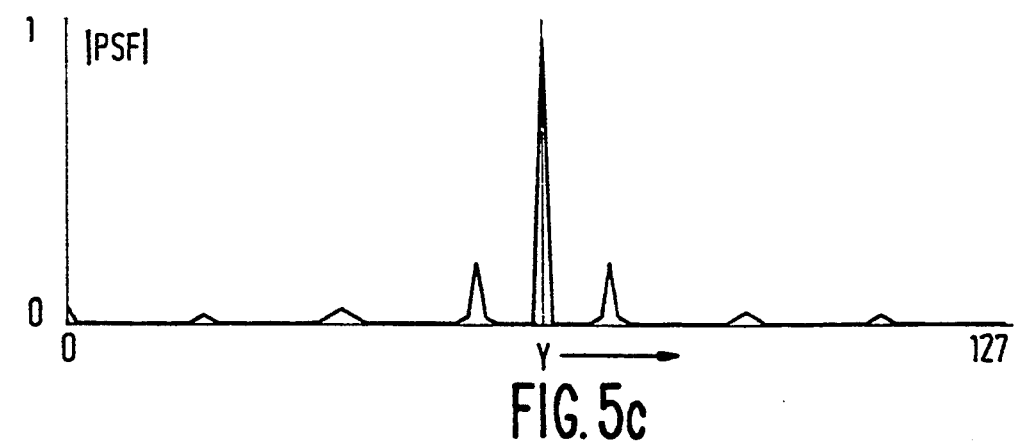
Figure 6A:
FIGS. 6a, 6b and 6c show the imaginary and real parts and the modulus of the point spread function resulting from another embodiment of the first realisation.
Figure 6B:
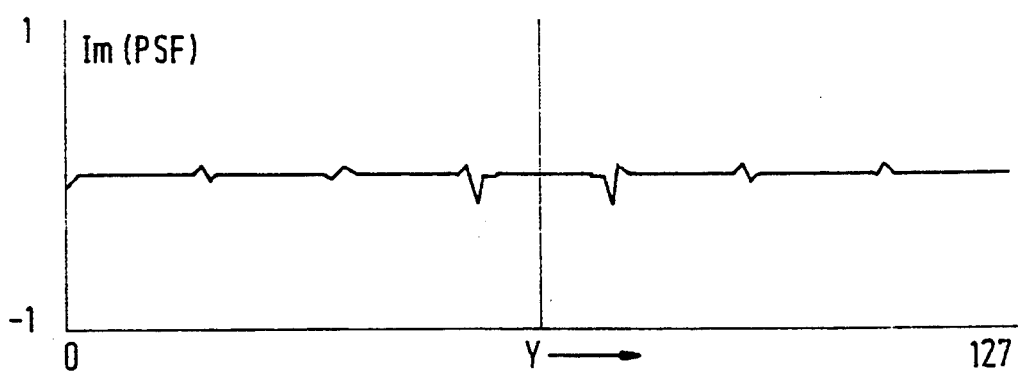
Figure 6C:
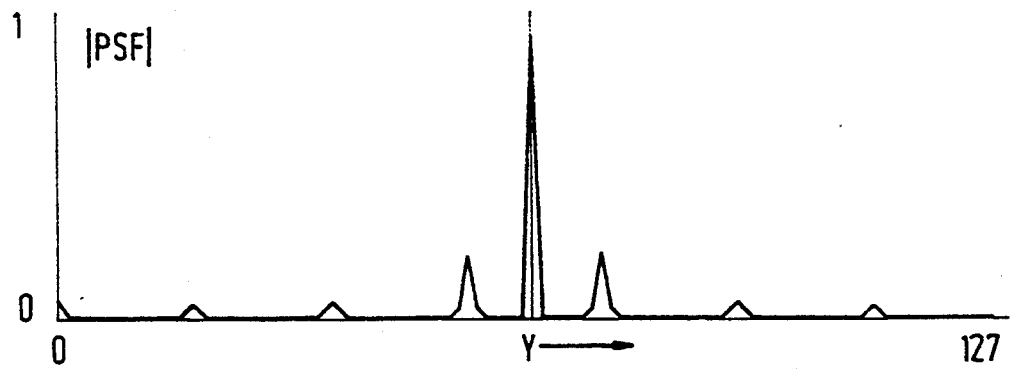

In the FIGS. 4a-c, 5a-c and 6a-c the effect of the alterations of the set of measurements on the point spread function (PSF(y)) are illustrated for phase encoding gradient pulses in the y-direction imposing phase encoding values $k_y$, having an offset or deviation $\Phi(k_y)$, whereby $\Phi(k_y)$ alternates between +and −20° between NMR-signals that are odd and even in the sequence. PSF(y) is mathematically the Fourier transform of a signal $e^{i\Phi}$ and indicates the contribution of a point in the body to the resulting image. The figures show the real and the imaginary part and the modulus of PSF(y) in parts a, b and c, respectively, for 128 different phase encoding values $k_y$, measured in a number of sequences. In FIGS. 4a, 4b and 4c these functions are shown for a conventional linearly interleaved set of sequences, stepping is in steps of 8 from −64 to +56, from −63 to +57, from −62 to +58, etc., for the first, second, third, . . . , sequences. In FIGS. 5a, 5b and 5c, stepping is also in steps of 8 and starts at −60, −59, −57, etc. in the first, second, third, . . . , sequences. The extreme negative values −64, −63, −62 and −61 are appended at the end of the last four sequences. The PSF functions shown in FIGS. 6a, 6b and 6c are obtained for 128 phases encoding values but measured in seven sequences, with a step interval between successive phase encoding values equal to the number of sequences. Analogous to the scheme shown in Table II, the phase encoding values are symmetrised around zero.

As can be seen from the figures, there is no large effect on the modulus of PSF(y), all effects are comprised in the real and imaginary parts. Due to the described distribution of the positive and negative phase encoding values over the even and odd rank numbers, in the altered sets of measurements the side lobes of PSF(y), causing the ghosts, are virtually completely in the imaginary part, and very little is left in the real part. As the ghosts are at 90° relative phase to the actual image, the ghost intensity will add up only quadratically i.e. $I=(I_r^2+I_i^2)^{\frac{1}{2}} \approx I_r$ for $I_r \gg I_i$, with I the total intensity and $I_r$ and $I_i$ the intensity in the real and imaginary parts, respectively. So, less distortion of the intensity profile results within the object results, in particular for ghosts in a large homogenous object. Using the real part only of the image values following the Fourier transformation, rather than the modulus, results in an image in which ghosting artefacts are absent.

In FIGS. 7a and 7b, two sequences of RF-pulses and gradient magnetic field pulses for obtaining NMR-signals according to a second realisation of the invention are shown. As the sequences are identical with the sequences shown in FIGS. 2 and 3, the phase encoding gradient $G_p$ excepted, only the $G_p$ gradients and the RF-pulses are shown. The first and last few RF-pulses and accompanying gradient pulses are indicated only. The sequence of phase encoding gradient pulses 242, 243, ..., 248 and 249, shown in FIG. 7a is linearly decreasing. The sequence of FIG. 7b has linearly increasing phase encoding gradient pulses 342, 343, ..., 348 and 349, the phase encoding in the two chains being time reversed copies of each other. After executing both sequences there are two measurements for each phase encoding value. If the sequences have an even number of refocusing RF-pulses, one of the two measurements follows an RF-pulse with an even and one with an odd rank number. Consequently, the phase error caused by imperfect RF-pulses and switched gradient fields is in first order opposite and the effect of two measurements is that the errors largely cancel. A second effect is that the $T_2$-decay, occurring in the course of a sequence is compensated for as one measurement is taken in the first half of a sequence and one is taken in the second half.

Figure 8A:
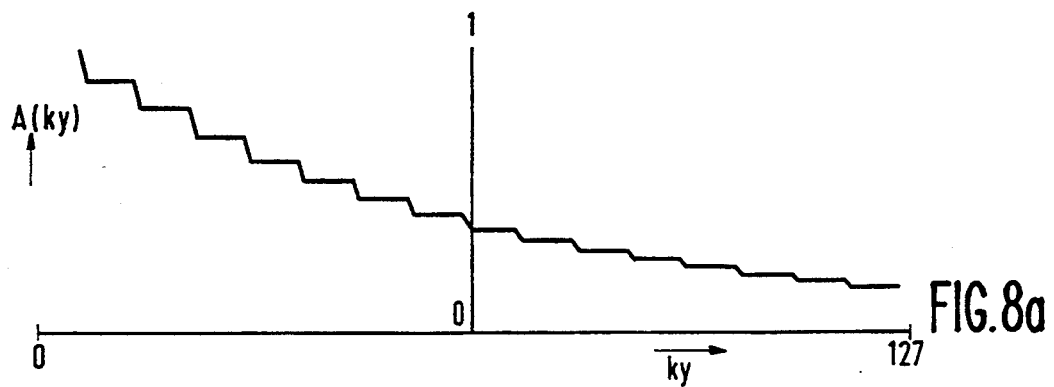
FIGS. 8a and 8b show the relative $T_2$-decay of a single sequence and of two combined sequences according to the second realisation.
Figure 8B:
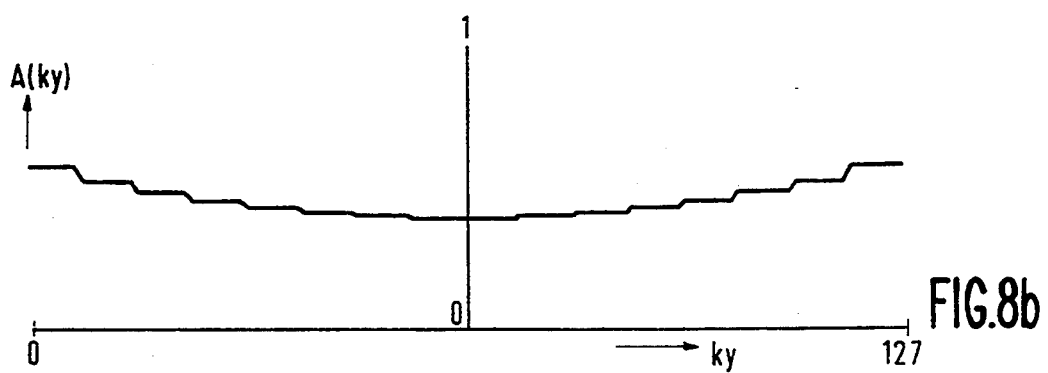
Figure 9A:
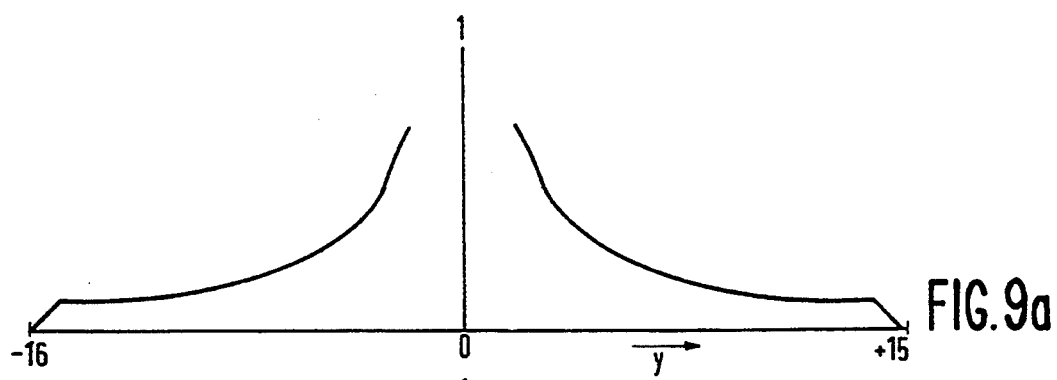
FIGS. 9a and 9b show the central part of the modulus of the point spread function for a single sequence and for two combined sequences according to the second realisation.
Figure 9B:
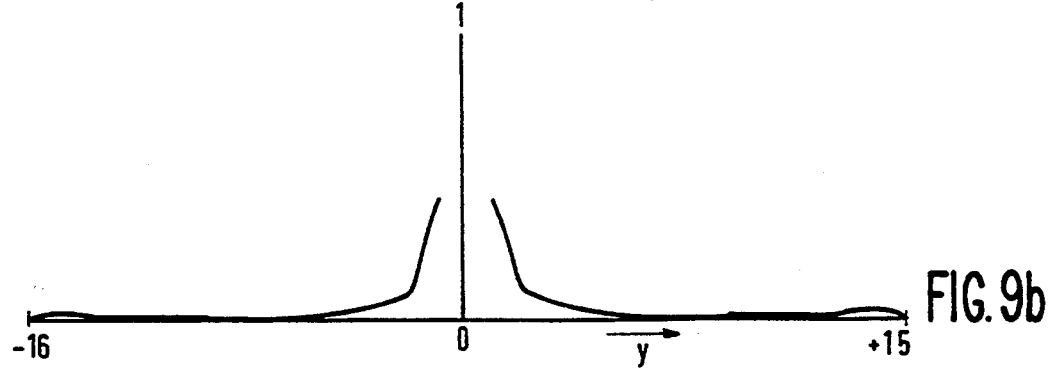

In FIGS. 8a and 8b the relative $T_2$-decay $A(k_y)$ of a single sequence and of two combined time-reversed sequences is shown as a function of the phase encoding value $k_y$, for 128 different phase encoding values determined in a series of interleaved sequences. As expected, the combined time reversed sequence shows much less amplitude variation. In FIGS. 9a and 9b the central part of the modulus of the point spread function is shown for both situations. As can be seen, the combination of two time-reversed sequences leads to a considerable narrower PSF(y). This indicates that artefacts and blurring due to the phase deviations and $T_2$-decay are largely removed in the resulting image. Investigation of the real and imaginary parts of PSF(y) shows that the imaginary pan is strongly reduced.

FIGS. 10a and 10b show two sequences of RF-pulses and gradient magnetic field pulses for obtaining NMR-signals according to another embodiment of the invention are shown. Like in FIGS. 7a and 7b, only the $G_p$ gradients and the RF-pulses are shown, the other gradient magnetic fields being identical to the ones shown in FIGS. 2 and 3. Only the first few RF-pulses and accompanying gradient field pulses are indicated only. The sequence of phase encoding gradient pulses 442, 443, 444, ..., shown in FIG. 10a is identical to the sequence shown in FIG. 2. In the sequence of FIG. 10b the phase encoding gradient pulses 542, 543, 544, ..., are pairwise swapped compared to the earlier sequence. The first (second) phase encoding gradient pulse 542 (543) in the second sequence being equal to the second (first) phase encoding gradient pulse 443 (442) in the first sequence, the third (fourth) phase encoding gradient pulse 544 (545) in the second sequence being equal to the fourth (third) phase encoding gradient pulse 445 (444) in the first sequence, etc. After executing both sequences there are two measurements for each phase encoding value, one following an RF-pulse with an even and one with an odd rank number. If the number of measurements is odd, this method can still be applied by leaving the last measurement unswapped. As in the sequences shown in FIGS. 7a and 7b, the phase errors caused by imperfect RF-pulses and switched gradient fields largely cancel. Despite the fact that the measured NMR-signals have a larger amplitude variation due to the $T_2$-decay, this embodiment gives better results in case the phase variation is more complicated than a simple alternation, for example, due to beat causing a phase change effect over a longer portion of a sequence. Examples of such behaviour are shown in FIGS. 12a and 12b, where curve 104 shows a beat pattern with nodes near echo numbers 13 and 26.

Figure 11:
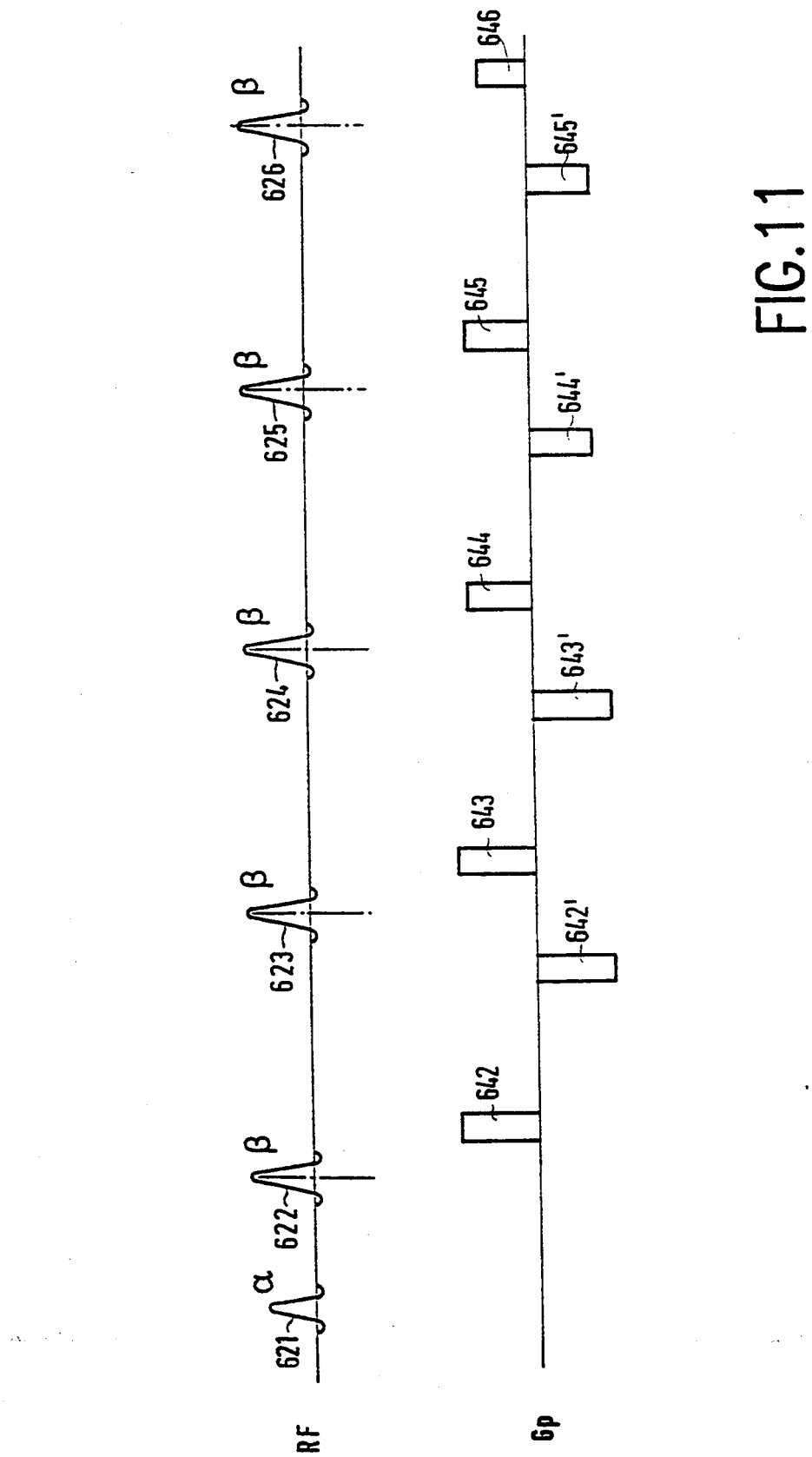
FIG. 11 shows a sequence of RF-pulses and gradient magnetic fields according to a further embodiment of the invention.

In FIG. 11 a further embodiment is shown. As hereinbefore, only the first few RF-pulses and phase encoding gradient pulses are indicated. In this embodiment a, preferably even, number of measurements with identical phase encoding gradients is performed consecutively. In FIG. 11 the number is two. The first two phase encoding gradient pulses 642 and 643 have identical values, as well as the second two 644 and 645, etc. As the size of the gradient pulses changes only gradually, the effect of eddy currents upon the phase of the nuclear spins is largely compensated due to the refocusing effect of the refocusing RF-pulses.

Figure 12A:
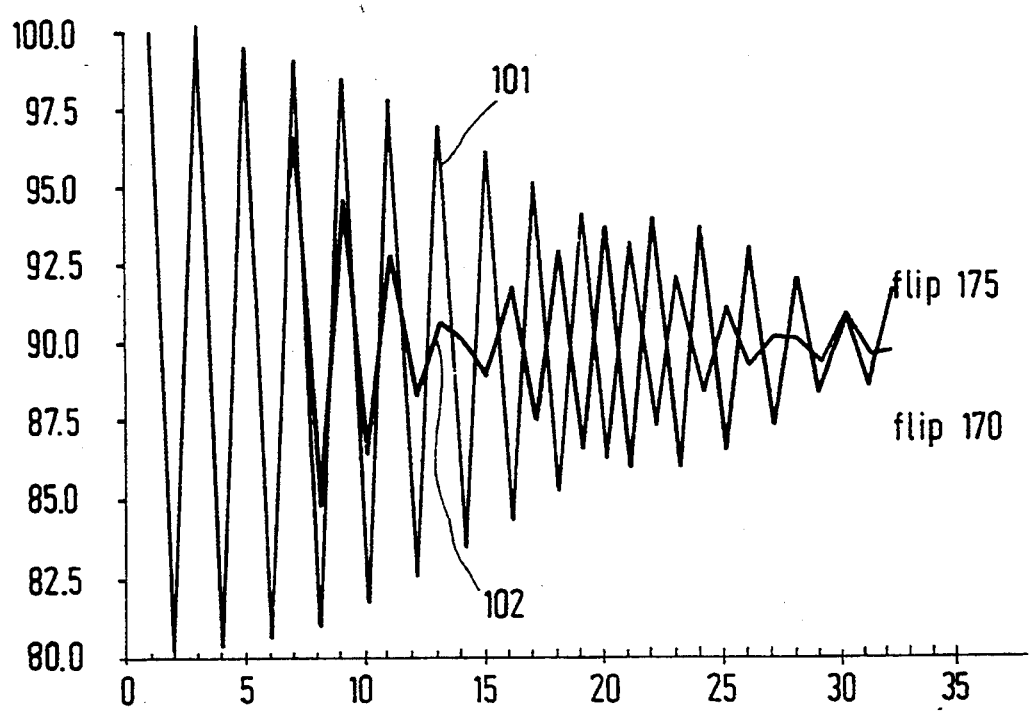
FIGS. 12a and 12b show an illustration of phase variations between different NMR-signals.
Figure 12B:
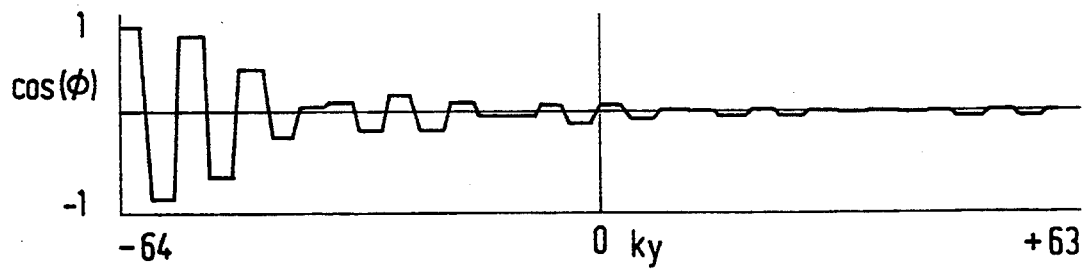
Figure 13A:
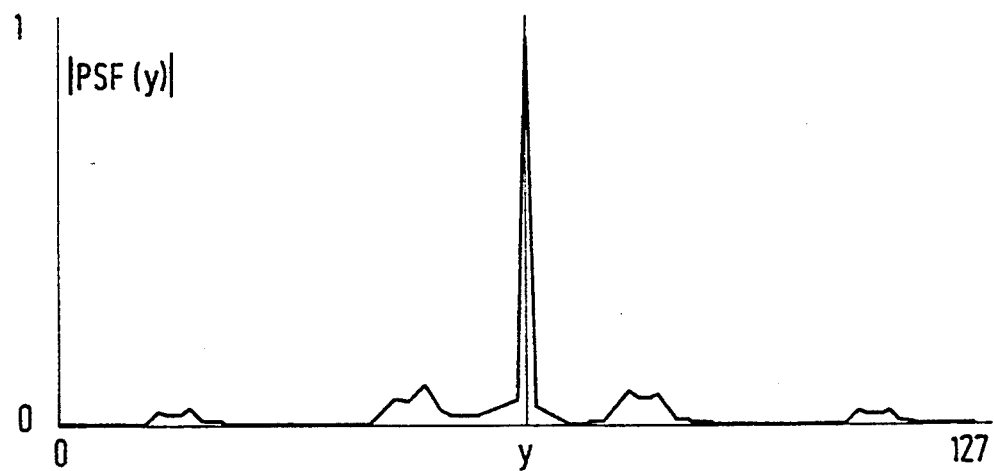
FIGS. 13a, 13b and 13c show a filter function according to a third realisation of the invention and the point spread functions obtained from unfiltered and filtered signals.
Figure 13B:
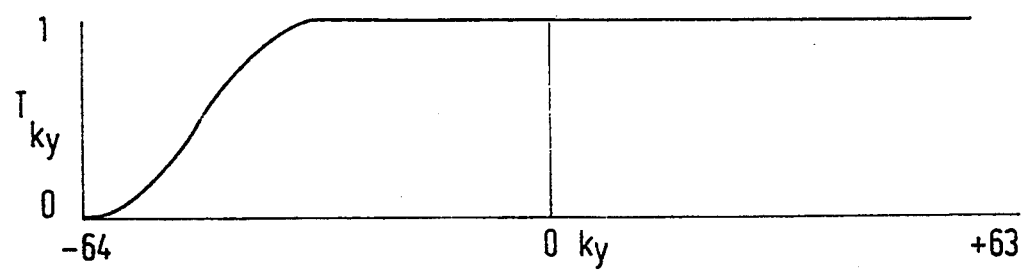
Figure 13C:
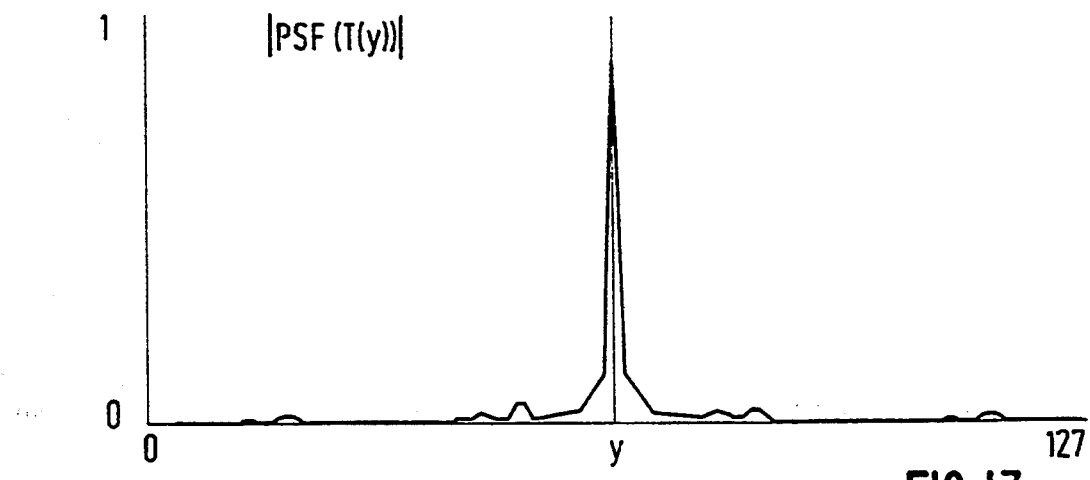

FIGS. 12a and 12b illustrate phase variations that may occur in a sequence of measuring NMR-signals. A data acquisition sequence, for example, a conventional sequence such as shown in FIG. 2 or a modified sequence as describe hereinbefore, comprises phase shifts at the level of the nuclear dipole moments, which phase shifts are caused by System imperfections, such as phase errors in the RF-pulses or eddy currents. As the flip angle of the refocussing RF-pulses is not a perfect 180°, the imperfections give rise to oscillations in the NMR-signal phase. The oscillations reduce with increasing rank number of the measured NMR-signal. The same kind of oscillations occur when the flip-angle of the refocusing RF-pulses differ from 180°. In FIG. 12a curve 101 connects the phases of NMR spin-echo signals occurring in a sequence in which there is a 10° phase deviation between the excitation RF-pulse and the refocusing RF-pulses, and in which the refocusing RF-pulses have a flip-angle of 175°. The curve 102 shows the phase behaviour for measurements with a 170° flip-angle of the refocusing RF-pulse and also a 10° phase deviation between excitation and refocusing RF-pulses. As the flip-angle of the refocusing pulses is not well determined but a distribution of a continuous range of flip-angles, the total contribution vanishes rapidly. This is illustrated in FIG. 12b, showing the cosine of the total phase contribution cos($\Phi$) for a number of different flip angles as a function of the phase encoding value $k_y$. As the $k_y$ values are chosen to be interleaved and increasing with the echoes, the $k_y$ value is closely related to the echo number. In FIG. 13a the modulus of the point spread function PSF(y) resulting from the measurements in FIG. 12b is shown. The influence of the variation of the phase behaviour can be suppressed by filtering the measured NMR-signals. In such filtering the NMR-signals are weighted with a function W, which is small for the first few signals in a sequence, i.e. for the echo-signals following early refocusing RF-pulses and which is 1 for the measurements following the later RF-pulses. The increase of W is related to the rank number of the refocusing RF-pulse. To avoid a variation in intensity across a homogeneous region, only high spatial frequencies are to be reduced and, consequently, the measurements early in a sequence should not be made with low phase encoding values. Satisfactory results, in terms of artefact suppression are obtained by using an asymmetric Tukey filter: $W(n)=\frac{1}{2}-\frac{1}{2}\cos((n-1)\pi/N)$ for $n \leq N$, and $W(n)=1$ for $n > N$. N is the number of NMR-signals in the beginning of a sequence of which the contribution is reduced and n is the rank number of a signal. In FIG. 13c this function is shown for N equal 8. In FIG. 13c, the modulus of the point spread function PSF(T(y)) is shown for NMR signals filtered according to this function. Comparison with the unfiltered function shown in FIG. 13a shows that the side lobes are considerably reduced.

We claim:

1. Method for magnetic resonance imaging of a body placed in a stationary and substantially homogeneous main magnetic field, the method comprising:
    applying an excitation radio-frequency pulse (RF-pulse) for excitation of nuclear dipole moments in at least a portion of the body,
    applying a plurality of refocusing RF-pulses and a plurality of gradient magnetic fields following said excitation RF-pulse for generating position dependent magnetic resonance signals in the excited portion, the gradient magnetic fields or refocusing RF-pulses having unintended imperfections resulting in a phase encoding of nuclear dipole moments with actual phase encoding values having deviations from nominal phase encoding values,
    measuring a set of magnetic resonance signals, the set comprising signals which follow at least a number of said refocusing RF-pulses, and
    transforming said set of measured magnetic resonance signals into an image, the set of signals being altered prior to said transformation for reducing the effect on said image of the deviations between said actual and said nominal phase encoding values.

2. Method according to claim 1, wherein the measured signals comprise imaginary and real pans and wherein the set of measurements is altered for having, after transformation, the effects of the phase deviations of the phase encoding values mainly in the imaginary pan of the image values resulting from the transformation.

3. Method according to claim 2, wherein signals are measured with opposite phase encoding values and a substantial fraction of those signals are both measured succeeding an RF-pulse with an even rank number or are both measured succeeding an RF-pulse with an odd rank number.

4. Method according to claim 3, wherein signals are measured in an even plurality of sequences, each sequence comprising an excitation RF-pulse, a plurality of refocusing RF-pulses alternated with measurements of magnetic resonance signals and switched gradient magnetic fields for phase encoding, the phase encoding values in the different sequences being linearly interleaved, and wherein the measurements with the extreme phase encoding values are all being measured first or all being measured last in a sequence.

5. Method according to claim 4, wherein signals are measured in a plurality of sequences, each sequence comprising an excitation RF-pulse, a plurality of refocusing RF-pulses alternated with measurements of magnetic resonance signals and switched gradient magnetic fields for phase encoding, the phase encoding values covering a phase encoding range in a plurality of discrete basic steps, and wherein the phase encoding values in the different sequences being linearly interleaved with a step size within a sequence corresponding to an odd number of basic steps.

6. Method according to claim 3, wherein signals are measured in a plurality of sequences, each sequence comprising an excitation RF-pulse, a plurality of refocusing RF-pulses alternated with measurements of magnetic resonance signals and switched gradient magnetic fields for phase encoding, the phase encoding values covering a phase encoding range in a plurality of discrete basic steps, and wherein the phase encoding values in the different sequences being linearly interleaved with a step size within a sequence corresponding to an odd number of basic steps.

7. Method according to claim 1, wherein the alteration of the set of measured signals comprises the measurement of equivalent signals for a substantial fraction of the measured signals and the averaging of the signals and the equivalent signals, the difference between the actual phases and the nominal phases for said signals and said equivalent signals being substantial opposite.

8. Method according to claim 7, wherein signals are measured in a plurality of sequences, each sequence comprising an excitation RF-pulse, a plurality of refocusing RF-pulses alternated with measurements of magnetic resonance signals and switched gradient magnetic fields for phase encoding, wherein for a substantial fraction of the sequences an equivalent sequence is executed in which the same gradient magnetic fields are applied to the body in time-reversed order for time-reversed detection of equivalent measured signals, the same phase encoding value occurring in one sequence in an odd rank number and in the equivalent sequence in an even rank number.

9. Method according to claim 7, wherein signals are measured in a plurality of sequences, each sequence comprising an excitation RF-pulse, a plurality of refocusing RF-pulses alternated with measurements of magnetic resonance signals and switched gradient magnetic fields for phase encoding, the equivalent measurements are obtained in an equivalent sequence in which the same gradient magnetic fields are applied to the body in pairwise swapped order.

10. Method according to claim 7, wherein the equivalent measurements are obtained with the same gradient magnetic field and following subsequent refocusing RF-pulses.

11. Method according to claim 1, wherein the gradient magnetic fields are switched for changing the phase encoding values between measurements, the largest phase encoding values being early in a sequence, and the alteration of the set of measured signals comprises weighting the measured signals with a weighting function that depends on the phase encoding value of each measurement in the set.

12. Method according to claim 1, wherein the refocusing RF-pulses have a value of around 150°.

13. Apparatus for magnetic resonance imaging of a body (7) placed in a stationary and substantially homogeneous main magnetic field comprising means for establishing a main magnetic field (2), means for generating gradient magnetic fields (3,4,5) superimposed upon the main magnetic field, means (6,8) for radiating RF-pulses towards a body (7) placed in the main magnetic field, control means (12) for steering the generation of the gradient magnetic fields and the RF-pulses, and means for receiving (6,10) and sampling magnetic resonance signals generated by sequences of RF-pulses and switched gradient magnetic fields, said control means (12) being arranged for said steering in sequences, each of which includes:
  applying an excitation radio-frequency pulse (RF-pulse) for excitation of nuclear dipole moments in at least a portion of the body,
  applying a plurality of refocusing RF-pulses following said excitation RF-pulse and gradient magnetic fields for generating position dependent magnetic resonance signals in the excited portion, and
  measurement of a set of magnetic resonance signals, the set comprising signals which follow at least a number of said refocusing RF-pulses,
  the apparatus further comprising means for transforming the set of measured magnetic resonance signals into an image, and means altering the set of signals to said transformation for reducing an effect on the image of deviations between the actual and nominal phase encoding values, which derivations are due to the refocusing RF-pulses or switched gradient magnetic fields.

14. In a method for magnetic resonance imaging of a body placed in a stationary and substantially homogeneous main magnetic field, said method including the steps of:
  applying a sequence of excitation radio-frequency pulses (RF-pulses) for exciting nuclear dipole moments in at least a portion of the body,
  applying a sequence of refocusing RF-pulses between each adjacent pair of the excitation RF-pulses,
  applying a phase encoding gradient magnetic field pulse between substantially each adjacent pair of the refocusing RF-pulses for generating position dependent magnetic resonance signals in the excited portion, each successive phase encoding pulse between any adjacent pair of excitation RF-pulses having a smaller integrated amplitude than a next preceding phase encoding pulse,
  applying a read gradient magnetic field pulse between each of the phase encoding pulses and a next successive refocusing RF-pulse to measure a set of magnetic resonance signals,
  applying a dephasing gradient magnetic field pulse between each of the read pulses and a next successive refocusing RF-pulse, each of the dephasing pulses being opposite in polarity and substantially equal in integrated amplitude to the phase encoding pulse which precedes it, and
  transforming said set of measured magnetic resonance signals into an image,
  wherein the image ordinarily contains artifacts and/or blurring due to residual phase effects in the nuclear dipole moments resulting from imperfections in the phase encoding and/or dephasing pulses and/or the refocusing RF-pulses, the improvement comprising the added step of:
  reducing the artifacts and/or blurring in said image by varying the phase of said phase encoding pulses and/or altering the order in which the phase encoding pulses are applied.

15. The improvement as defined in claim 14 wherein a sequence of phase encoding pulses applied between an adjacent pair of excitation RF-pulses has phase encoding pulses with relatively higher integrated amplitudes at each end of the sequence and phase encoding pulses with relatively lower integrated amplitudes in the middle of the sequence.

16. The improvement as defined in claim 14 wherein a sequence of phase encoding pulses applied between an adjacent pair of excitation RF-pulses includes positively and negatively phased encoding pulses in approximately equal number.

17. The improvement as defined in claim 14 wherein successive sequences of phase encoding pulses applied between successive adjacent pairs of excitation RF-pulses are phased oppositely.

* * * * *